United States Patent [19]

Yamazaki et al.

[11] Patent Number: 4,932,584
[45] Date of Patent: Jun. 12, 1990

[54] METHOD OF WIRE BONDING

[75] Inventors: Nobuto Yamazaki, Tokyo; Takeshi Hasegawa, Saitama; Junkichi Enomoto, Tokyo; Yoshimitsu Terakado, Tokyo; Shinichi Kumazawa, Tokyo, all of Japan

[73] Assignee: Kabushiki Kaisha Shinkawa, Tokyo, Japan

[21] Appl. No.: 304,804

[22] Filed: Jan. 31, 1989

[51] Int. Cl.⁵ .................................. B23K 31/02
[52] U.S. Cl. ................................... 228/179
[58] Field of Search ............ 228/173.5, 179, 4.5, 228/6.1, 179

[56] References Cited

U.S. PATENT DOCUMENTS 4,327,860 5/1982 Kirshenboin et al. ............. 228/179
4,378,902 4/1983 Fedak ................................. 228/179
4,437,604 3/1984 Razon et al. ....................... 228/179
4,445,633 5/1984 Bonham .............................. 228/179

FOREIGN PATENT DOCUMENTS 6342135 2/1988 Japan ............................. 228/173.5

Primary Examiner—M. Jordan
Attorney, Agent, or Firm—Koda & Androlia

[57] ABSTRACT

A wire bonding method for connecting a first bonding point and a second bonding point via a wire including the steps of first connecting the wire to the first bonding point, raising a capillary slightly and moving it slightly away from the second bonding point, raising the capillary further by an amount sufficient for forming the wire loop with the wire being played out, moving the capillary over the second bonding point along a circular track which has a radius sufficient for forming the wire loop, and connecting the wire to the second bonding point.

3 Claims, 2 Drawing Sheets

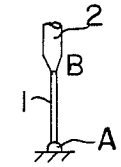
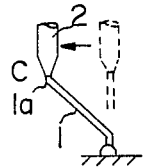
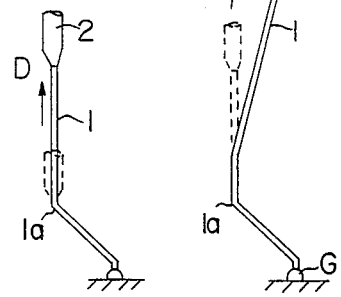
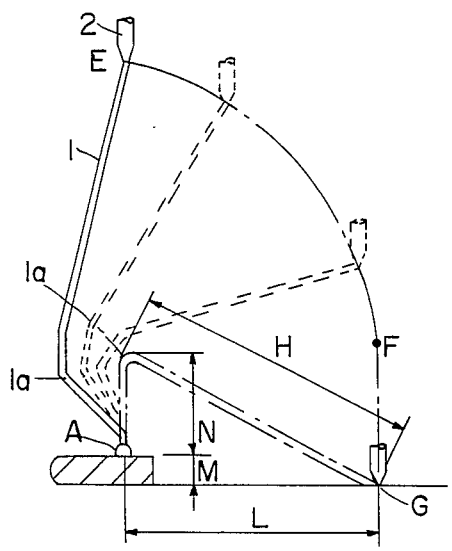

METHOD OF WIRE BONDING

BACKGROUND OF THE INVENTION

1. Field of the Invention

The present invention relates to a wire bonding method for connecting a first bonding point and a second bonding point via a wire in an assembly process for a semiconductor device and more particularly to a method for forming a wire loop in an assembly process for a semiconductor device.

2. Prior Art

Conventionally, a wire loop is, as disclosed in Japanese Patent Application Laid-Open No. 58-220436, formed by first connecting a wire to a first bonding point. A capillary is then raised high enough for forming a wire loop with the wire being played out. The capillary is then moved along a circular track centered at a desired loop height, and the wire is connected to the second bonding point.

In this method, the capillary is simply raised from the first bonding point with the wire played out and then moved to the second bonding point along a circular track. As a result, the wire does not necessarily bend from the center of the circular track all the time. Accordingly, in cases where the bent portion of the wire is lower than the center of the circular track, the wire loop may sag or bend, etc., due to an excessive amount of wire protruding in one portion of the loop. This is especially common in cases where the distance between the first bonding point and the second bonding point is as large as 3 to 4 mm.

SUMMARY OF THE INVENTION

Accordingly, the object of the present invention is to provide a wire bonding method which makes it possible to obtain good loop formation with stable loop height.

The abovementioned and other objects of the present invention are accomplished by the unique method of the present invention in which a wire is first connected to a first bonding point, a capillary is then raised slightly and moved slightly in a direction opposite the direction of the second bonding point, the capillary is then raised an amount sufficient to form a wire loop with the wire being played out. Next, the capillary is moved over the second binding point along a circular track which has a radius sufficient to form a wire loop, and the wire is thereafter connected to the second bonding point.

Since the capillary is raised slightly and moved in a direction opposite the direction of the second bonding point after the wire has been connected to the first bonding point, a first bend in the wire is formed in the portion of the wire located at the bottom end of the capillary. Then, when the capillary is raised an amount sufficient for the formation of a wire loop with the wire being played out and moved over to the second bonding point along the circular track, which has a radius large enough for the formation of the wire loop, the wire further bends from the first bent area. Thus, the first bend forms the apex of the loop, so that a wire loop having good form and stable loop height is obtained.

BRIEF DESCRIPTION OF THE DRAWINGS

FIGS. 2(a) through 2(e) are explanatory diagrams which illustrate the wire loop obtained as a result of the capillary track at various points in time.

DETAILED DESCRIPTION OF THE INVENTION

Figure 1:
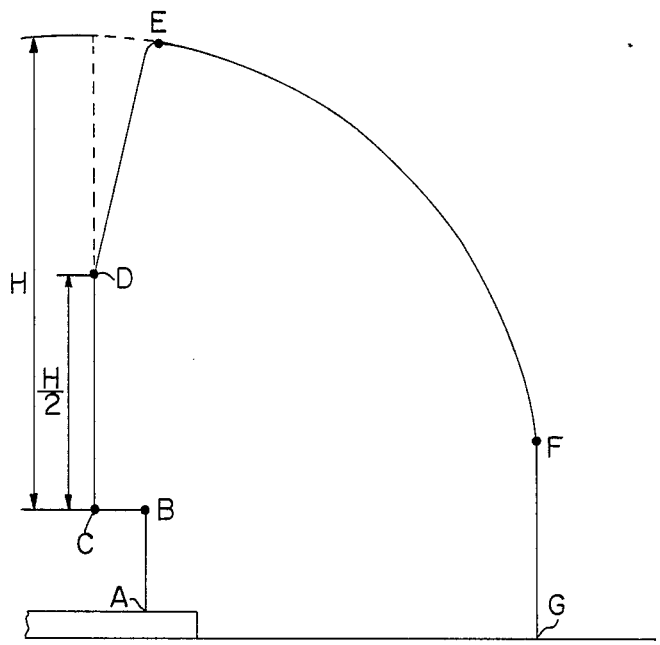
FIG. 1 is an explanatory diagram which illustrates the capillary track of one embodiment of the present invention.

A clamp which clamps a wire 1 is in a open state, and the wire 1 is first connected to first bonding point A. Then, a capillary 2 is raised to point B. After stopping temporarily or for an instant at this point B, the capillary 2 is moved horizontally to a point C in a direction opposite the direction of a second bonding point G. As a result, the wire 1 is oriented at a position inclined from point A to point C as shown in FIG. 2(b), and a bend 1a is formed in the portion of the wire 1 located at the bottom end of the capillary 2.

After being stopped temporarily or for an instant at point C, the capillary 2 is raised to point D. The point D is as high as half of the distance H required to form the wire loop (the distance H will be described later), with the wire 1 being played out during the movement of the capillary 2.

The capillary 2 is further raised an amount equal to half of the distance H and is stopped after being positioned at point E, which is directly above the first bonding point A. The clamp is then closed. When the clamp is closed, the wire 1 will not be played out even if the capillary 2 is subsequently moved. In this state, the wire 1 has the form illustrated by the solid lines in FIGS. 2(d) and 2(e).

The capillary 2 is moved along a circular track; radius of this track being equal to the distance H, and the capillary 2 reaches a point F, which is located above the second bonding point G. The capillary 2 is then lowered to the second bonding point G, and bonding is performed as illustrated in FIG. 2(e). As a result of the circular track of the capillary 2 illustrated in FIG. 2(e), the wire 1 is bent via a bending action centered at the bend 1a, so that the area of the bend 1a becomes the apex of the wire loop. Accordingly, the form of the wire loop is stable, and sagging or deformation of the loop is prevented. Furthermore, since the bend 1a is the apex of the wire loop, the height of the loop can be freely controlled by merely setting the location of the bend 1a.

The method used to set the distance H required for forming the wire loop will be described below:

Assuming that L is the distance between the first bonding point A and the second bonding point B, M is the height difference between the first bonding point A and the second bonding point G, and N is the loop height, then:

$$H = \sqrt{(M + N)^2 + L^2}$$

The amount of movement of the capillary 2 from the point A to point B, and the amount of movement of the capillary 2 from point B to point C is as follows:

The amount of movement of the capillary 2 from point A to point B is set in the range of 50 to 1,000 microns. The amount of movement of the capillary 2 from point B to point C is set in the range of 20 to 1,000 microns. The amounts of movement is set at optimal values in accordance with the strength of the wire 1, i.e., wire diameter, hardness, etc.

Judging from the results of actual bonding experiments, the proper standards are: The amount of movement from point A to point B is approximately 3 to 15 times the wire diameter, and the amount of movement from point B to point C is approximately half of the amount of movement from point A to point B.

For example, if the wire diameter is 25 microns, the amount of movement from point A to point B is in the range of 200 to 400 microns, and the amount of movement from point B to point C is in the range of 100 to 200 microns. The position of the bend 1a in the wire 1 can be varied by changing the setting of these amounts of movement. Since the area of the bend 1a in the wire 1 forms the apex of the loop, the loop height can be adjusted by setting the amounts of movement.

As is clear from the above description, according to the present invention, a bend is first formed in a portion of the wire which forms the apex of the wire loop, and the wire is bent further by a bending action centered on this initially bent portion of the wire. As a result, the height of the loop is stable, and a wire loop with good form is obtained.

We claim:

1. A method of wire bonding for connecting a first bonding point and a second bonding point via a wire, said method comprising the steps of:

connecting said wire to said first bonding point;
vertically raising a capillary slightly and then stopping for an instant;
moving said capillary slightly in a horizontal direction opposite the direction of said second bonding point and then stopping for an instant;
further vertically raising said capillary by an amount less than an amount sufficient for formation of a wire loop which would reach said second bonding point with said wire being played out;
further raising said capillary by another amount equal to a remainder of said amount sufficient for formation of said wire loop with said wire being played out while moving said capillary to a point directly above said first bonding point;
clamping said wire so that said wire cannot play out of said capillary;
moving said capillary over said second bonding point along a circular track which has a radius sufficient for forming said wire loop; and
connecting said wire to said second bonding point.

2. A method of wire bonding according to claim 1, wherein said amount sufficient for formation of said wire loop is equal to $$\sqrt{(M + N)^2 + L^2},$$

wherein M is a height difference between said first and second bonding points, N is a loop height and L is a distance between said first and second bonding points.

3. A method according to claim 1, wherein said amount less than an amount sufficient to form a wire loop is equal to one half of said amount sufficient to form a wire loop.

* * * * *